United States Patent [19]

Thackeray et al.

[11] Patent Number: 4,921,778
[45] Date of Patent: May 1, 1990

[54] PHOTORESIST PATTERN FABRICATION EMPLOYING CHEMICALLY AMPLIFIED METALIZED MATERIAL

[75] Inventors: James W. Thackeray, Braintree; Stephen A. Fine, Peabody, both of Mass.

[73] Assignee: Shipley Company Inc., Newton, Mass.

[21] Appl. No.: 226,282

[22] Filed: Jul. 29, 1988

[51] Int. Cl.$^5$ .............................................. G03C 5/16
[52] U.S. Cl. .................................. 430/326; 430/327; 430/330
[58] Field of Search ............... 430/327, 330, 313, 326; 156/628

[56] References Cited

U.S. PATENT DOCUMENTS

| | | | |
|---|---|---|---|
| 4,357,369 | 11/1982 | Kilichowski et al. | 427/90 |
| 4,396,704 | 8/1983 | Taylor | 430/311 |
| 4,426,247 | 1/1984 | Tamamura et al. | 156/643 |
| 4,430,153 | 2/1984 | Gleason et al. | 156/643 |
| 4,433,044 | 2/1984 | Meyer et al. | 430/271 |
| 4,552,833 | 11/1985 | Ito et al. | 430/325 |
| 4,613,389 | 9/1986 | Tanaka | 156/143 |
| 4,613,398 | 9/1986 | Chiong et al. | 156/628 |

FOREIGN PATENT DOCUMENTS 23937 2/1982 Japan ................................. 430/327
71-44715 3/1986 Japan .

OTHER PUBLICATIONS

Visser et al., "Mechanism and Kinetics of Silylation of Resist Layers...", Proceedings of SPIE, vol. 771, 1987, pp. 1-7.

Primary Examiner—Jose G. Dees
Attorney, Agent, or Firm—Robert L. Goldberg

[57] ABSTRACT

The present invention is directed to a method for the formation and dry development of photoresists treated only in a thin layer (i.e., approx. 2000 Angstroms thick) so as to be treated with an organometallic material. Treatment of this thin layer of the resist formulation in the process of the present invention is preferably accomplished by the vapor phase exposure of the resist formulation to an organometallic material such as a silylating compound capable of reacting with the resist formulation. The resist formulation also contains a photoacid generator, capable of releasing an acid which either causes the hydrolysis of the exposed portions of the resist that were created with organometallic vapor, or prevents the reaction of the organometallic vapor with the exposed portion of the resist.

32 Claims, 1 Drawing Sheet

PHOTORESIST PATTERN FABRICATION EMPLOYING CHEMICALLY AMPLIFIED METALIZED MATERIAL

BACKGROUND OF THE INVENTION

The present invention is directed to a method of forming photoresist patterns having micron and submicron dimensions These photoresists find use in fabrication of complex structures such as those in electronic devices and magnetic thin film heads. The present invention also is directed to unique photoresist compositions that are capable of being used in the present method. The present invention also describes various organometallic reagents that are useful in the present method.

Many of the recent advancements in electronic devices and components have resulted from improvements in manufacturing techniques. Some of the most important improvements have occurred in microlithography and in methods of transferring the patterns used to create the complex structures within the electronic devices.

One of the preferred methods of transferring patterns of micron and submicron dimensions is dry etching. This method utilizes plasma or reactive ion etching to remove specific areas of material on a surface so that a pattern remains. In many instances, this method of pattern creation has replaced older processes which used solvent development of a material to create the pattern. These wet processing techniques frequently did not permit the dimensional control desired in the creation of micron and submicron dimensional patterns.

Typically, the material to be dry etched to create a pattern is a polymeric material for reasons of ease of use, material properties and cost considerations. When an organic polymer is used, dry etching can be done using an oxygen plasma or oxygen reactive ion etching.

During oxygen plasma and/or oxygen reactive ion etching, the organic content of a polymer is converted to a gaseous form which is easily removed. In order to create the desired pattern, there must be some areas of the polymeric material which are made resistant to the etching materials, and other areas which are not reactive therewith.

One method of producing such an etch-resistant polymeric material is to utilize a polymeric resist material containing silicon in a sufficiently large quantity so that exposure to oxygen plasma, for example, results in formation of silicon oxides, which form a protective layer and prevent the conversion of the polymer to its gaseous form.

Examples of silicon-containing copolymers, comprising a compound containing an acrylate moiety and a silicon containing oxime ester of methacrylic acid, which act as a positive resist and which can be dry developed are disclosed in U.S. Pat. No. 4,433,044 to Meyer et al.

A method of selectively removing a portion of a layer of material on a substrate by oxygen plasma etching, utilizing a mask of resist material comprising a poly (silane sulfone) copolymer is disclosed in U.S. Pat. No. 4,357,369 to Kilichowski et al. A method of producing solid state devices by dry etching of a resist film comprising a silicon-containing or nonsilicon-containing but organometallic monomer-containing polymer is described in U.S. Pat. No. 4,396,704 to Taylor.

Another method for forming a micropattern using a technique similar to those set forth above is disclosed in U.S. Pat. No. 4,430,153 to Gleason et al. The method involves forming an etch barrier in the reactive ion etching of an aromatic polyamic acid/imide polymer.

Another method for forming a micropattern using a technique similar to those above is disclosed in U.S. Pat. No. 4,426,247 to Tamamura et al.

Recently, processes have been developed which permit selective conversion of portions of a non-silicon-containing resist to a silicon-containing etch-resistant resist. The non-silicon-containing resist is exposed to patterned radiation to create a latent image within the resist. Examples of this method of obtaining dry-developable multilayer resists are described in U.S. Pat. No. 4,552,833.

In U.S. Pat. No. 4,613,398 to Chiong et al., there is described a method for producing oxygen etch-resistant polymeric films which incorporate a protective oxide-forming metal permeated into the polymer. These films are useful as positive tone resist patterns for use with dry development techniques.

The present invention represents yet another advance in this art.

SUMMARY OF THE INVENTION

The present invention is directed to a method for the formation and dry development of photoresist formulations treated in at least a portion of the thin top layer thereof, with an acid-hydrolyzeable organometallic material.

The present invention is also directed to a method using unique photoresist formulations that contain one or more photo-acid generators (PAGs). These compounds release strong acid in the presence of light, and can either (a) remove an organometallic material from the polymeric backbone by hydrolysis, or (b) prevent an organometallic material from reacting with a polymeric backbone. The photoresist formulation is not limited to PAGs, but photo-acid components (PACs) are also useful.

The present invention is also directed to a method of using organometallic materials that react with the polymeric backbone of the resist formulation to provide etch mask character.

BRIEF DESCRIPTION OF THE DRAWINGS

FIGS. 6 to 10 illustrate schematically another preferred embodiment of the present invention (Scheme IB) wherein vapor phase organometallic treatment occurs after exposure of the resist.

DETAILED DESCRIPTION OF THE PREFERRED EMBODIMENTS

Figure 1:
FIGS. 1 to 5 illustrate schematically one preferred embodiment of the present invention (Scheme IA) wherein vapor phase organometallic treatment occurs prior to exposure of the resist.

This invention represents a new dry process utilizing unique surface chemistry combined with dry processing and unique resist compositions useful thereof. The process schemes of two preferred processes are outlined in FIGS. 1 and 2. This invention also describes the use of organometallic reagents of a specific type and character.

The reagents and methods of the present invention afford increased resolution ability in resist pattern fabrication due to the fact that only about 2000 Angstroms of the resist film needs to be exposed. This eliminates previous concerns of phenolic absorption in the film. Also based upon this surface chemistry, the aspect ratio and sidewall profile benefit from dry processing.

It will be recognized by those of ordinary skill in this art that this process relies on unique surface chemistry and is based upon the discovery that certain preferred materials are capable of hydrolyzing the trimethyl silyl group from a poly(p-vinyl) phenol or novolak backbone.

While the drawings call specifically for one preferred organometallic treatment (i.e., silylation) it is to be understood that this is merely illustrative of the presently most preferred embodiment, and that the alternative organometallic compounds described herein can readily be substituted in the process schemes outlined in the drawings accompanying this disclosure.

Figure 3:
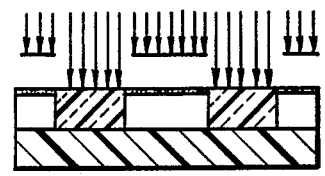
Figure 4:

Referring in detail to the drawings, it will be appreciated that, as illustrated in FIG. 1, a substrate is initially coated with a resist formulation containing a photoacid generator. A thin (e.g., ≦2000 Angstrom) layer of silylated resist is FIGS. 5 to 10 illustrate Exposure of this coated resist film to deep U.V. radiation releases the strong photogenerated acid in the exposed areas which desilylates the film in the exposed areas FIG. 3. The silyl hydrolysis products are removed during a postexposure bake out (PEB) FIG. 4. For example, when hexamethyldisilazane (HMDS), the preferred silylating agent is employed, the post exposure bake drives out hexamethyl disiloxane, the product of acid hydrolysis.

Figure 5:

Dry development of the resulting partially desilylated resist film using a conventional oxygen etch system, affords the desired pattern, a positive tone image as shown in FIG. 5.

Figure 2:

As illustrated in FIG. 2, Scheme IB is directed to a modification of the Scheme IA process, in which the resist formulation, containing a photoacid generator, is again coated on a substrate, but prior to silylation is subjected to an exposure step. This deep U.V. exposure causes the release of the strong photogenerated acid in the exposed areas. Treatment of this exposed resist with a silylating agent such as hexamethyl disilazane caused selective penetration of only the unexposed areas of the resist film The photo generated acid prevents silylation in the exposed areas.

During a postexposure bake (PEB) step, that portion of the resist film wherein the strong photo-generated acid was released (i.e., the exposed areas) is removed.

Dry development of the resulting partially desilylated resist film using a conventional oxygen etch system, affords the desired pattern, a positive tone image.

As the acid-hydrolizeable organometallic material employed herein, the skilled artisan will readily recognize that in addition to HMDS, numerous other organometallic compounds of this type are available for use herein.

One preferred group of such compounds are the tetra-substituted organometallic species. These compounds have the generic formula:

$$R_1R_2R_3R_4-M$$

wherein;

M is selected from the group consisting of Si, Sn, Ti, P, Ge, and Zr, preferably Si; and the organic substituents $R_1$-$R_4$ are each independently selected from the group consisting of alkyl, preferably $C_1$-$C_{16}$, more preferably $C_1$-$C_{10}$, most preferably, $C_1$-$C_6$; aryl, preferably phenyl or alkyl substituted phenyl; and a suitable leaving group such as halogen, preferably Cl, Br, or I.

Similarly, substituted organometallic amine species such as;

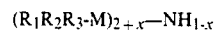

wherein;

x=0 or 1;

M is selected from the group consisting of Si, Sn, Ti, Ge, and Zr, preferably Si; and the organic substituents $R_1$-$R_3$ are each independently selected from the group consisting of alkyl, preferably $C_1$-$C_{16}$, more preferably $C_1$-$C_{10}$, most preferably, $C_1$-$C_6$; and aryl, preferably phenyl, alkyl substituted phenyl; may be used herein.

As described above, the most preferred compound of this type, HMDS, which is more completely known as 1,1,1,3,3,3-hexamethyldisilazane, has the formula:

Of the PAGs and PACs useful herein, the skilled artisan will readily be able to select from the available compounds of this type. One preferred class of such PACs are the diazonaphthoquinone sulfonic acid compounds of the type:

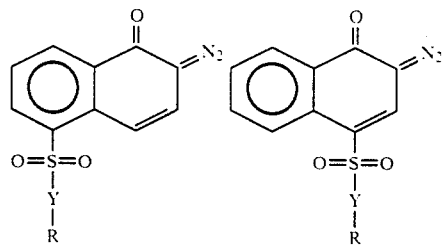

wherein:

Y=O or N; and R is selected from the group consisting of alkyl, preferably $C_1$-$C_{16}$, more preferably $C_1$-$C_{10}$, most preferably, $C_1$-$C_6$; and aryl, preferably phenyl, alkyl substituted phenyl.

One preferred resist formulation of the present invention contains poly(p-vinyl) phenol and as a photoacid generator, a halogenated aromatic compound of the formula:

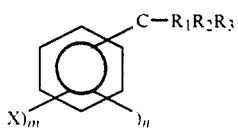

wherein:

X=Cl, Br, F, or I;

n is an integer from 1 to 10 inclusive;

m is an integer from 1 to 10 inclusive; and the organic substituents $R_1$-$R_3$ are each independently selected from the group consisting of alkyl or aryl groups.

Another preferred resist formulation of the present invention contains poly(p-vinyl) phenol and a photoacid generator consisting of halogenated aromatic compounds of the formula:

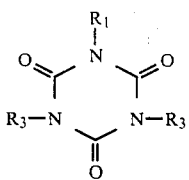

wherein:

the substituents $R_1$-$R_3$ are each independently selected from the group consisting of hydrogen, and halogenated (F, Br, Cl, I) alkyl groups. An especially preferred PAG of this type is tris(2,3-dibromopropyl)-isocyanurate.

After mixing the various ingredients in a suitable solvent, the resist formulation is first spin coated and pre-baked.

In one preferred embodiment of the method of the present invention, the resist film containing either a PAG, a PAC, or mixtures thereof, is then subjected to a thin film treatment by the acid hydrolyzable organometallic compound, i.e., reaction of the organometallic compound with no more than about the first 2000 Angstroms thickness of polymer backbone comprising the film. The remaining thickness of the resist film stays unreacted.

This thin-film reacted resist film is next exposed with deep UV irradiation. In the exposed areas, a photogenerated acid is produced which causes the hydrolysis of the organometallic species from the poly(p-vinyl) phenol backbone. This leads to break down of the etch mask character of the film in the exposed areas after appropriate post exposure heat treatment.

Dry development of the baked resist causes break down of the etch mask character in the exposed areas.

In a second preferred embodiment of the present invention, the PAC/PAG containing resist film described above, is exposed with deep UV radiation prior to the step when the organometallic compound is reacted therewith.

Exposure of the resist film causes a release of the photo generated acid, which in turn prevents reaction between the polymer backbone of the resist formulation and the organometallic compound in the exposed areas. In this embodiment, the selectivity is built into the organometallic treatment step.

The present invention will be further illustrated with reference to the following examples which will aid in the understanding of the present invention, but which are not to be construed as a limitation thereof. All percentages reported herein, unless otherwise specified, are percent by weight. All temperatures are expressed in degrees Celsius.

EXAMPLE 1

A positive tone resist pattern was obtained in the following manner:

A polymeric resist material comprising a mixture of 5.0 g of a photoacid generator (PAG), such as tris(2,3-dibromopropyl)- isocyanurate and 20 g of a novolak resin, such as m-cresol novolak, was formulated with a standard photoresist solvent, such as, propylene glycol or monomethyl ether acetate.

The resist solution was dispensed in 2.0 ml quantities on a 75 mm wafer to give 1.0 micron coatings upon baking at 80° C. for 60 seconds on a hot plate. The resist films were then silylated with hexamethyl disilazane (HMDS) in vapor phase using a commercially available Monarch 150 silylation apparatus. Typical silylating conditions were 150° C. for 70 seconds under 100 mtorr of HMDS. The resist was then exposed on an HTG Deep UV contact printer with exposures ranging from 10 to 50 mJ/cm$^2$.

The silylated wafers were next baked at 100° C. for 60 seconds on a hot plate. Dry development was done on a Plasma Technologies oxygen reactive ion etcher under the conditions of 20 cc. $O_2$, 20 mtorr pressure, 100 watts bias. After 4 minutes, 2.0 micron lines were resolved, with vertical sidewalls. One-half micron of resist was retained. The lines remained where exposed, indicative of a positive tone image.

EXAMPLE 2

Resist compositions were prepared again as in Example 1. The resist solution was dispensed in 2.0 ml quantities on a 75 mm wafer. The composition was subjected to softbake conditions of 80° C. for 60 seconds on a hot plate, yielding a resist film. The film coating was then exposed on an HTG deep UV contact printer with exposures ranging from 10 to 50 mJ/cm$^2$.

The exposed wafers were then silylated at 150° C. for 35 seconds on a Monarch 150 silylation apparatus. The wafers were then baked at 100° C. for 60 seconds on a hot plate. Dry development was conducted on a Plasma Technologies Oxygen reactive ion etcher under the conditions of 20 cc $O_2$, 20 mtorr pressure, 100 watts bias.

After 4 minutes, 3.0 micron lines were resolved, with vertical sidewalls. Where resist remained, there was 0.35 micron resist left. These images constituted a positive image system.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of forming a patterned layer on a substrate comprising:
    (a) coating the substrate with a polymeric photoresist composition containing one or more photoacid generating agents or photoacid components;
    (b) drying the coating to form a resist film;
    (c) coating the resist film with a thin layer of an organometallic reagent;
    (d) exposing selected portions of the coated film with a source of radiation, thereby producing strong acids which convert the organometallic reagent to a hydrolyzed by-product product;
    (e) baking the exposed film to drive off the hydrolzed organometallic reagent; and
    (f) dry developing the film to remove the remaining reactive portions by etching in an oxygen plasma.

2. The method of claim 1 or 2, wherein the polymeric materials in the photoresist composition are selected from the group consisting of poly(p-vinyl)-phenols, the novolak resins, polyvinyl pyrollidones, and mixtures thereof.

3. The method of claim 1 or wherein the photoacid generator is selected from the group consisting of halogenated aromatic compounds of the formula:

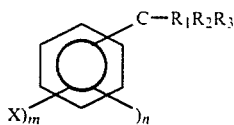

wherein:
X = Cl, Br, F, or I;
n is an integer from 1 to 10 inclusive;
m is an integer from 1 to 10 inclusive; and
the organic substituents $R_1$–$R_3$ are each independently selected from the group consisting of alkyl or aryl groups.

4. The method of claim 3, wherein the the organic substituents $R_1$–$R_3$ are each independently $C_1$–$C_{16}$ alkyl groups.

5. The method of claim 4, wherein the the organic substituents $R_1$–$R_3$ are each independently $C_1$–$C_{10}$ groups.

6. The method of claim 3, wherein the the organic substituents $R_1$–$R_3$ are each independently $C_1$–$C_6$ groups.

7. The method of claim 3, wherein the the organic substituents $R_1$–$R_3$ are each independently phenyl or alkyl substituted phenyl.

8. The method of claim 1, wherein the photoacid generator is selected from the group consisting of halogenated aromatic compounds of the formula:

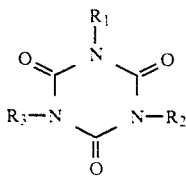

wherein:
the substituents $R_1$14 $R_3$ are each independently selected from the group consisting of hydrogen, and halogenated (F, Br, Cl, I) alkyl groups.

9. The method of claim 8, wherein the the halogenated alkyl groups are each independently $C_1$–$C_{16}$ alkyl groups.

10. The method of claim 8, wherein the the halogenated alkyl groups are each independently $C_1$–$C_{10}$ groups.

11. The method of claim 9, wherein the the halogenated alkyl groups are each independently $C_1$–$C_6$ groups.

12. The method of claim 1, wherein the organometallic compound is selected from the compounds having the formula:

$$R_1R_2R_3R_4\text{—M}$$

wherein;
M is selected from the group consisting of Si, Sn, Ti, P, Ge, and Zr; and
the organic substituents $R_1$–$R_4$ are each independently selected from the group consisting of alkyl, aryl, and a suitable leaving group, with the proviso that one such substituent is a leaving group.

13. The method of claim 12, wherein M is Si.

14. The method of claim 12, wherein up to three of the organic substituents $R_1$–$R_4$ are each independently selected from the group consisting of $C_1$–$C_{16}$ alkyl.

15. The method of claim 12, wherein up to three of the organic substituents $R_1$–$R_4$ are each independently selected from the group consisting of $C_1$–$C_{10}$ alkyl.

16. The method of claim 12, wherein up to three of the organic substituents $R_1$–$R_4$ are each independently selected from the group consisting of $C_1$–$C_6$ alkyl.

17. The method of claim 12, wherein up to three of the organic substituents $R_1$–$R_4$ are each independently selected from the group consisting of phenyl or alkyl substituted phenyl.

18. The method of claim 12, wherein at least one of the leaving groups is a halogen selected from the group consisting of F, Cl, Br, or I.

19. The method of claim 12, wherein at least one of the leaving groups is an amino group of the formula $NR_1R_2$.

20. The method of claim 12, wherein at least one of the leaving groups is an alkoxy group of the formula $OR_1$.

21. The method of claim 1, wherein the organometallic compound is selected from the compounds having the formula:

$$(R_1R_2R_3\text{—M})_{2-x}\text{—NH}_{1-x}$$

wherein;
x = 0 or 1;
M is selected from the group consisting of Si, Sn, Ti, Ge, and Zr; and the organic substituents $R_1$–$R_3$ are each independently selected from the group consisting of alkyl and aryl.

22. The method of claim 21, wherein M is Si.

23. The method of claim 21, wherein the organic substituents $R_1$–$R_3$ are each independently selected from the group consisting of $C_1$–$C_{16}$ alkyl.

24. The method of claim 21, wherein the organic substituents $R_1$–$R_3$ are each independently selected from the group consisting of $C_1$–$C_{10}$ alkyl.

25. The method of claim 21, wherein the organic substituents $R_1$–$R_3$ are each independently selected from the group consisting of $C_1$–$C_6$ alkyl.

26. The method of claim 21, wherein the organic substituents $R_1$–$R_3$ are each independently selected from the group consisting of phenyl and alkyl substituted phenyl.

27. The method of claim 1, wherein the photoactive compound is selected from compounds having the formula:

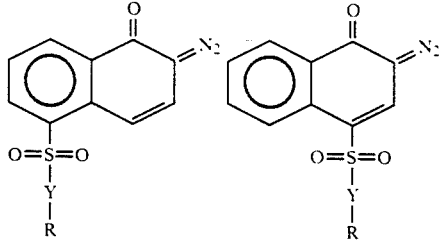

wherein
Y is selected from the group consisting of O, S, N, and C; and
R is selected from the group consisting of alkyl and aryl substituents.

28. The method of claim 27, wherein R is selected from the group consisting of $C_1$–$C_{16}$ alkyl.

29. The method of claim 27, wherein R is selected from the group consisting of $C_1$–$C_{10}$ alkyl.

30. The method of claim 27, wherein R is selected from the group consisting of $C_1$–$C_6$ alkyl.

31. The method of claim 27, wherein R is selected from the group consisting of phenyl and alkyl substituted phenyl.

32. The method of claim 1, wherein the photo-acid generator is selected from the triaryl sulfonium salts and the diaryl iodonium salts.

* * * * *